United States Patent
Wu et al.

(10) Patent No.: US 6,756,838 B1
(45) Date of Patent: Jun. 29, 2004

(54) CHARGE PUMP BASED VOLTAGE REGULATOR WITH SMART POWER REGULATION

(75) Inventors: Dandan Wu, Sunnyvale, CA (US); Pierre Dermy, Nevada City, CA (US)

(73) Assignee: T-Ram, Inc., San Jose, CA (US)

(*) Notice: Subject to any disclaimer, the term of this patent is extended or adjusted under 35 U.S.C. 154(b) by 0 days.

(21) Appl. No.: 10/391,326

(22) Filed: Mar. 18, 2003

(51) Int. Cl.[7] .................................................. G05F 1/10
(52) U.S. Cl. ........................................................ 327/536
(58) Field of Search ................................. 327/530, 534, 327/535, 536, 537

(56) References Cited

U.S. PATENT DOCUMENTS

| | | | |
|---|---|---|---|
| 5,161,096 A | 11/1992 | Newman | |
| 5,399,928 A | 3/1995 | Lin et al. | |
| 5,532,640 A | 7/1996 | Okunaga | |
| 5,532,960 A | 7/1996 | Lin et al. | |
| 5,699,018 A | 12/1997 | Yamamoto et al. | |
| 5,841,314 A | 11/1998 | Brigati et al. | |
| 5,946,225 A | 8/1999 | Ryu et al. | |
| 6,091,282 A | * 7/2000 | Kim | 327/536 |
| 6,151,255 A | 11/2000 | Joo et al. | |
| 6,166,968 A | 12/2000 | Song | |
| 6,208,197 B1 | * 3/2001 | Ternullo et al. | 327/536 |
| 6,229,161 B1 | 5/2001 | Nemati et al. | |
| 6,278,317 B1 | * 8/2001 | Hsu et al. | 327/536 |
| 6,424,202 B1 | 7/2002 | Bartlett | |

OTHER PUBLICATIONS

Jieh–Tsorng Wu, Kuen–Long Chang, "MOS–Charge Pumps for Low Voltage Operation," IEEE Journal of Solid State Circuits, vol. 33, No. 4, Apr. 1998, pp. 592–597.

* cited by examiner

Primary Examiner—Jeffrey Zweizig

(57) ABSTRACT

A charge pump based voltage regulator with smart power regulation employs an architecture that requires that the charge pump current be a linear combination of the load current and a clamp current with a possible offset current. The smart power regulation is based on automatic load activity (or load current) detection using the clamp current. The clamp current and the filtered charge pump current are compared with one another; and the charge pump current is then adjusted accordingly by stepping the frequency of the clock driving the charge pump, optimizing the power consumption of the entire voltage regulator with varying load activity. The negative voltage regulation is independent of the integrated circuit positive supply voltage. In one embodiment, a derivative of the desired output voltage is compared with a reference voltage to generate a clamp current control signal. In another embodiment, the reference voltage is solely positive.

33 Claims, 16 Drawing Sheets

CHARGE PUMP BASED VOLTAGE REGULATOR WITH SMART POWER REGULATION

BACKGROUND OF THE INVENTION

1. Field of the Invention

This invention relates generally to voltage regulators, and more particularly to a charge pump based voltage regulator with smart power regulation.

2. Description of the Prior Art

A conventional SRAM device employs SRAM cells, each cell consisting of four or six transistors. A thyristor based SRAM cell consists of only two devices, the thyristor itself, and a pass transistor. An SRAM device comprising thyristor SRAM cells will thus be much more compact and much less costly.

Switching between the on state and the off state of a thyristor however, takes rather a long time due to the long life time of the minority carriers in the P-base. This characteristic undesirably limits the speed of operation of a thyristor-based SRAM. A thinly capacitively coupled thyristor (TCCT) to significantly speed up the switching has been disclosed in U.S. Pat. No. 6,229,161, entitled Semiconductor capacitively-coupled NDR Device And Its Applications In High-Density High-Speed Memories And In Power Switches, issued May 8, 2001 to Nemati et al. A TCCT employs an additional gate closely coupled to a base region. This gate is coupled to a control line commonly known as word line 2 (WL2), which is pulsed from a negative voltage to a positive voltage when the TCCT is in its write operation. The negative voltage is necessary to lower the P-base potential and allows the carriers in the P-base to flow out quickly during the write operation, significantly expediting the switching of TCCT states. FIG. 1 illustrates a TCCT cell in a CMOS process.

Conventional SRAM products based on six-MOSFET memory cells are powered-up by a positive voltage supply and usually do not require a negative voltage source to operate.

It would therefore be desirable and advantageous in view of the foregoing to provide a technique to generate an on-chip negative supply for the WL2 in a TCCT-based SRAM array from the positive voltage supply powering-up the integrated circuit (IC).

Figure 1:
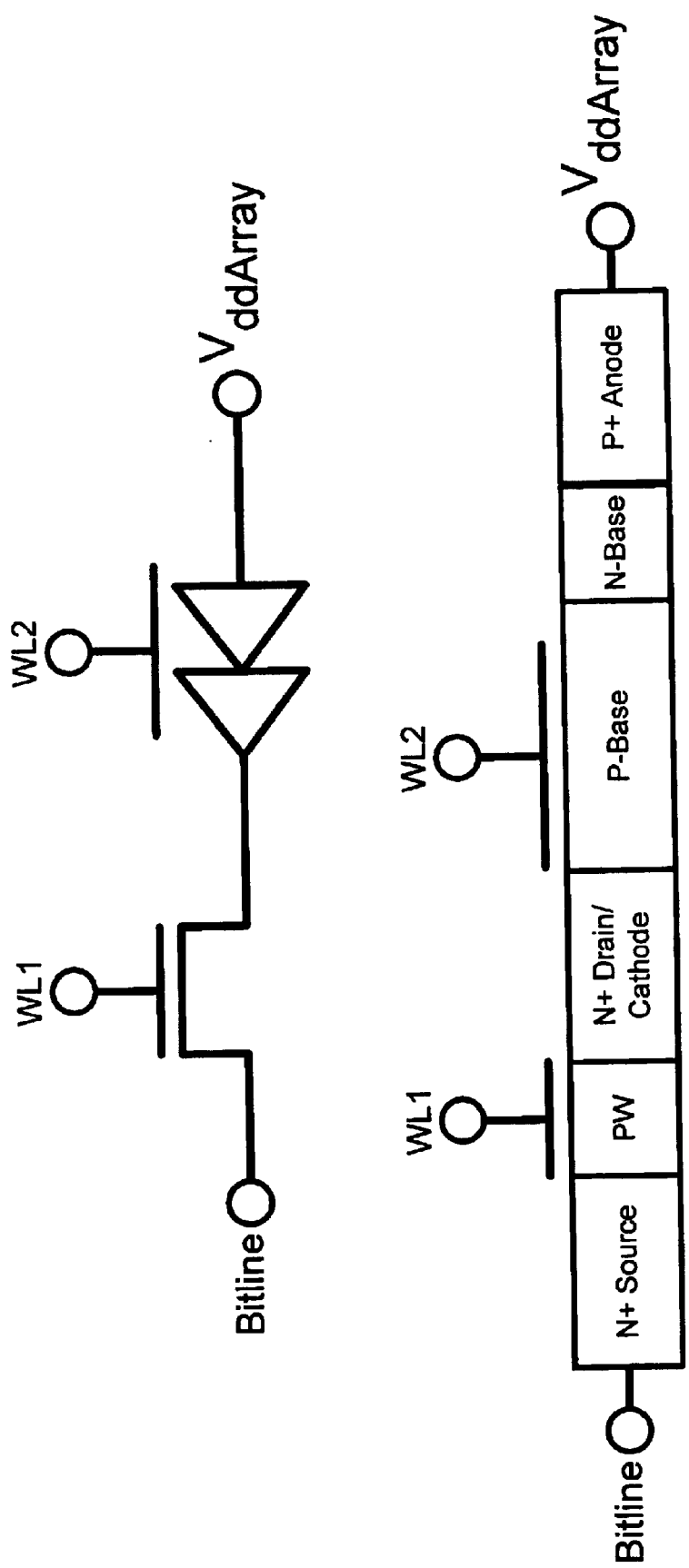
FIG. 1 illustrates a TCCT in series with a pass gate (NMOSFET) in a CMOS process.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAIL DESCRIPTION OF THE INVENTION

Charge pumps (CPs) are commonly used inside an IC to generate either a negative voltage or a positive voltage larger than the external supply voltage powering-up the IC. CPs of various types (NMOSFET or PMOSFET-based, with or without bootstrapping) have been developed since the early days of silicon-based MOS technologies. They were also implemented in bipolar technologies. CPs are notorious for three undesirable deficiencies. First and foremost they are very inefficient in terms of circuit area and overall power dissipation. They require a large amount of capacitor which occupies a large area on an IC (relatively to other circuit blocks and functions on the IC). Their inefficiency is further worsened by their sensitivity to leakage currents and the effect of circuit parasitic capacitances. CP power efficiency is very low, often less than 10% and seldom above 25%. The efficiency tends to decrease as the CP output current loading requirements and the magnitude of the output voltage are increased. For instance, in order to deliver a 2 mA output current at an output voltage of approximately 2.0 V (either below the IC ground level, as in the case of the negative voltage generator (NVG) discussed below, or above the positive supply that is used to power-up the IC), the CP draws a total current in the order of 25 mA from the IC external supply.

The second limitation of MOSFET-based CPs is their inaccurate and unstable output voltage with varying loading conditions. This lack of accuracy and stability is due to the switched capacitor nature of or the charge transfer mechanism in CPs. It is further worsened by the rate of variation with time in the CP loading conditions. Extended dynamic loading requires more filtering, more CP output storage and as a consequence more CP internal capacitor for a fixed average output load current.

The third major detrimental CP characteristics (which is related to the previous two) is the limited output current capability. CP circuits commonly described in specialized technical publications produce output currents in the order of tens of microamperes or 100 to 200 $\mu A$ at best. The loading requirements placed on the WL2 NVG for the TCCT-based SRAM arrays developed by T-RAM, Inc. is ten times or one order of magnitude greater than the maximum capacity commonly reported to this date.

Based on the above considerations, it appears highly desirable for the technical and commercial viability of TCCT-based SRAM arrays, either as a standalone IC or a building block or memory function in a larger IC such as a Microcontroller ($\mu C$), Microprocessor ($\mu P$), Network Processor (nP), Digital Signal Processor (DSP) or Application Specific Integrated Circuit (ASIC), to implement a NVG by attaching an output voltage regulator to a negative voltage CP. Furthermore it is very important that this NVG be implemented in such a way that it can conserve power and improve the power efficiency thereby minimizing the overall IC power dissipation. Specifically, the power consumption of the CP should be adjustable during various operating modes of the SRAM array, e.g., when the current loading requirements on the NVG is changed between a minimum value and a maximum value (either gradually or abruptly), or continuously at a more or less rapid rate of change, or in discrete steps of more or less greater height and more or less closely spaced in time. It would be even more desirable and advantageous to provide a general architecture for implementing voltage regulation with smart power regulation based on automatic load activity detection wherein the architecture and associated methods are independent of the voltage supply (internal or external) that powers up the IC. A number of applications in the fields of large and dense non-volatile memories, photodetectors and image sensors, specialized analog interfaces can greatly benefit from the technique and methods described herein.

The various methods of supply voltage regulation and conversion developed over time in the fields of electronic power supply generation, conversion and management have been classified in two major categories: "linear" and "switch-Mode." Each category presents a set of graded advantages. The advantages of the "linear" category are voltage accuracy, low-noise figures, ease of use and complexity management. The primary advantage of the "switch-mode" category is power efficiency. A subset of the switch-mode category is the purely switched-capacitor type. CP falls within this sub-category. Another subset of switch-mode regulator is commonly referred to as a "boost converter." As previously mentioned their accuracy and stability with load variations is quite low, although it may be adequate for certain applications (such as in certain DRAM and most conventional non-volatile memory technologies). The linear category is further divided into "drop-out" and "clamp" subcategories. Linear drop-out Regulators (LDO) take an input supply voltage and reduce it a lower absolute value i.e. less negative from an input below the ground plane, or less positive from an input above the ground plane. LDO operates on the principle of supplying more or less current to the load and modulating the conductance of a pass transistor which usually is a large power device. LDO regulators can be further sub-categorized by the type and biasing of the voltage drop-out device, either NMOS or PMOS, NPN or PNP bipolar transistors, biased either as a voltage follower in a common drain or collector configuration, or as a phase inverter in a common source or emitter configuration. Each of these circuit topologies presents its specific advantage when considering the quality and requirements of load and line regulations.

In contrast to a LDO regulator, a clamp regulator operates on the principle of adding a dummy load in parallel to the specified regulator output load, and modulating the conductance of this dummy load to compensate for variations in the regulator output load. The dummy load is a smaller device than the voltage dropout power transistor and therefore modulating its drive requires less power. In cases where output load variations are limited in amplitude, or in cases where they are very rapid (also referred to as high dynamic output loads), a clamp regulator is more power efficient. This is achieved by maintaining the voltage dropout pass-transistor under a constant bias rather than modulating it in the LDO regulator configuration. In certain cases of a high dynamic load with large fluctuations, combining a LDO and a clamp regulator in a dual regulation loop is an appropriate solution. The stability of a dual loop system must be carefully studied and sometimes trimmed. Therefore such hybrid technique is usually considered only when the load variations are somewhat predictable and can be characterized within definable limits in time and amplitude.

Another advantage of a clamp regulator is that it is more compact and efficient. A clamp regulator to maintain the output voltage of a CP supplying the negative WL2 voltage to the TCCT-based SRAM array, or producing a positive voltage greater than the IC supply voltage, is a more feasible and/or attractive solution when compared to an LDO regulator (which would require a CP output voltage of greater magnitude than the output voltage specified in the application), or to a boost converter (which would require a larger amount of switched-capacitor within the IC or capacitors and other magnetic components and even specialized diodes external to the IC). Also this clamp regulation technique readily lends itself, without further increase in the overhead power dissipation and the CP output voltage, to the attachment of two relatively small sensing current mirrors. One is connected in parallel with the CP output blocking transistor. The other is connected in parallel with one of the transistors in the current clamping branch of the clamp regulator attached to the CP output. The output of these two current sensors can be used to not only monitor the load current, but also as the feedback variable in a separate control loop to maintain the CP activity and resulting power dissipation at the minimum level to insure proper operation and stability of the NVG. This second loop is a current loop, as the feedback variable being measured and controlled is a difference between two sensed currents.

The present invention is directed to a charge pump based NVG with clamp-type output voltage regulation and with smart power regulation of the charge pump current to optimize the overall power efficiency of the NVG. The general architecture relies on the fact that the charge pump delivers a current equal to a linear combination of the load current and the current through the clamp of the voltage regulator or clamp current. Note that this linear combination also includes the possible presence of an offset current. The smart power regulation is based on automatic detection or sensing of both the clamp current and the charge pump output current, and a comparison of these two currents. The clamp current and the filtered charge pump current are compared with one another, and the charge pump current is then adjusted accordingly by stepping the frequency of the clock driving the charge pump, optimizing the power consumption of the entire NVG with varying load activity.

According to one embodiment, a charge pump based negative voltage generator (CPNVG) is provided that is responsive to an output load current and its variations, wherein the clamp current is the difference between the charge pump output current and the CPNVG output load current.

Figure 2:
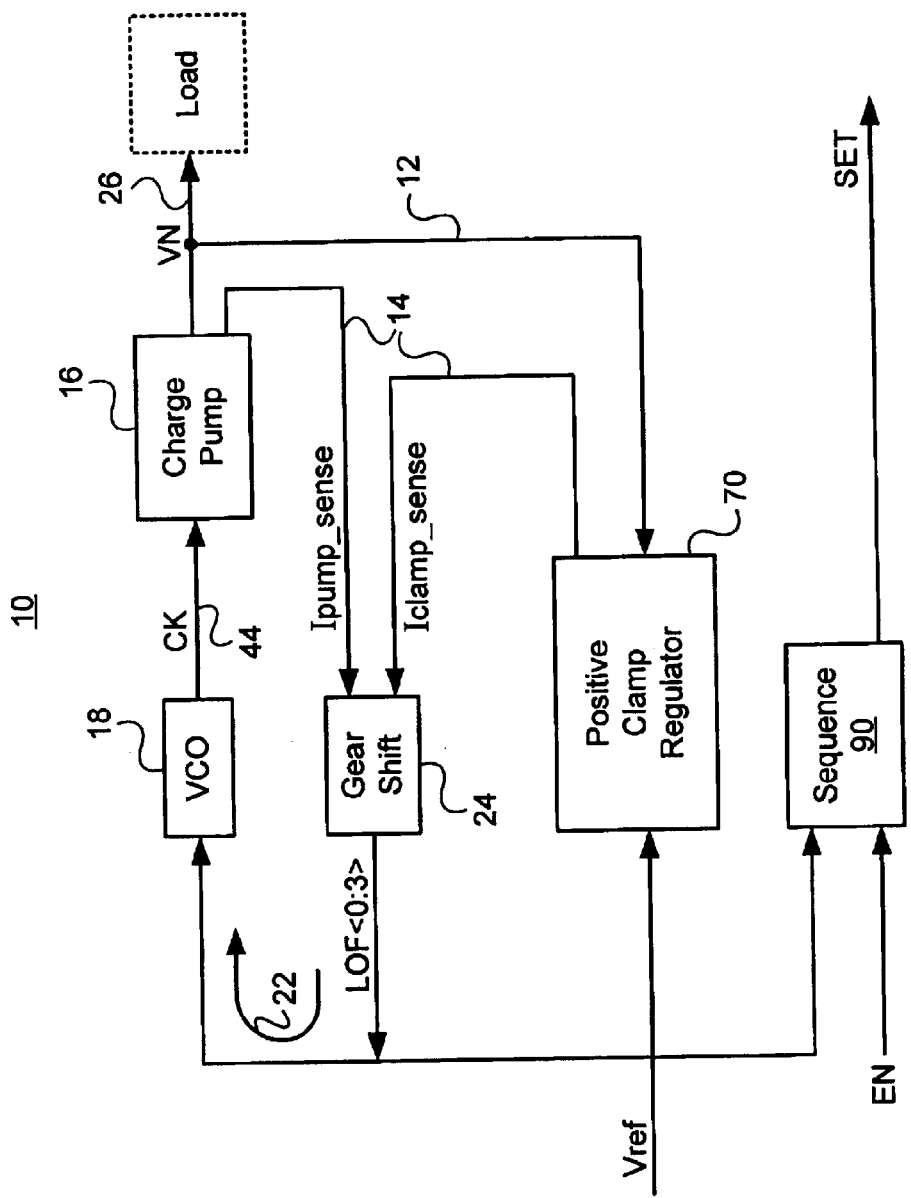
FIG. 2 is a simplified schematic diagram illustrating a charge pump based negative voltage generator with smart power regulation according to one embodiment of the present invention.

Looking at FIG. 2, a simplified block diagram illustrates a negative voltage regulator 10 according to one embodiment of the present invention. It shall be understood however, that the present invention is not so limited, and that although the particular embodiments described herein below refer to a negative voltage regulator, the present invention applies equally to both positive and negative voltage regulators. With continued reference to FIG. 2, negative voltage regulator 10 may, for example, generate an on-chip negative supply for the word line 2 (WL2) in a TCCT-based SRAM array. Regulator 10 is based on dual loop regulation consisting of a voltage loop 12 and a current loop 14. Since these two loops 12, 14 are closely coupled within one feedback circuit, they will herein after be collectively referred to as a voltage/current loop. The main building blocks associated with negative voltage regulator 10 include a negative voltage charge pump 16, a voltage-controlled oscillator (VCO) 18 and a positive clamp regulator frequency compensation circuit 70.

A current loop segment 22 is employed by the negative voltage regulator 10 to minimize power consumption in various operating modes of the load e.g., SRAM array discussed herein before. The current loop segment 22 includes a gear shift circuit 24 using direct detection of charge pump 16 current as a feedback parameter.

Figure 3:
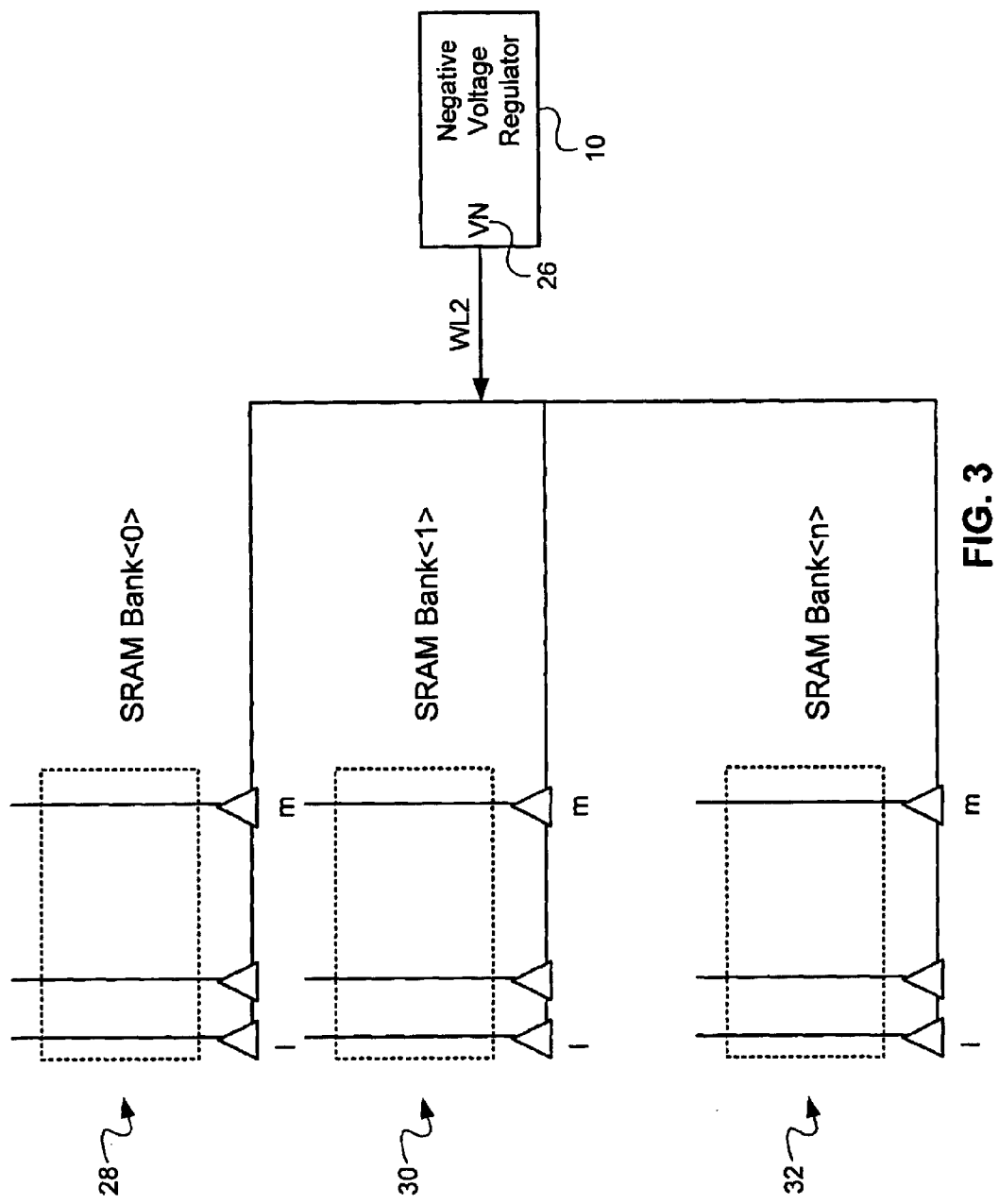
FIG. 3 is a simplified block diagram illustrating a negative voltage regulator driving a plurality of WL2s associated with a plurality of SRAMs.

The negative voltage regulator 10 generates a negative voltage supply VN 26 that is also shown in FIG. 3 which is a simplified block diagram illustrating the negative voltage regulator 10 driving a plurality of word line 2 (WL2) drivers associated with a plurality of SRAM banks 28, 30, 32.

Figure 4:
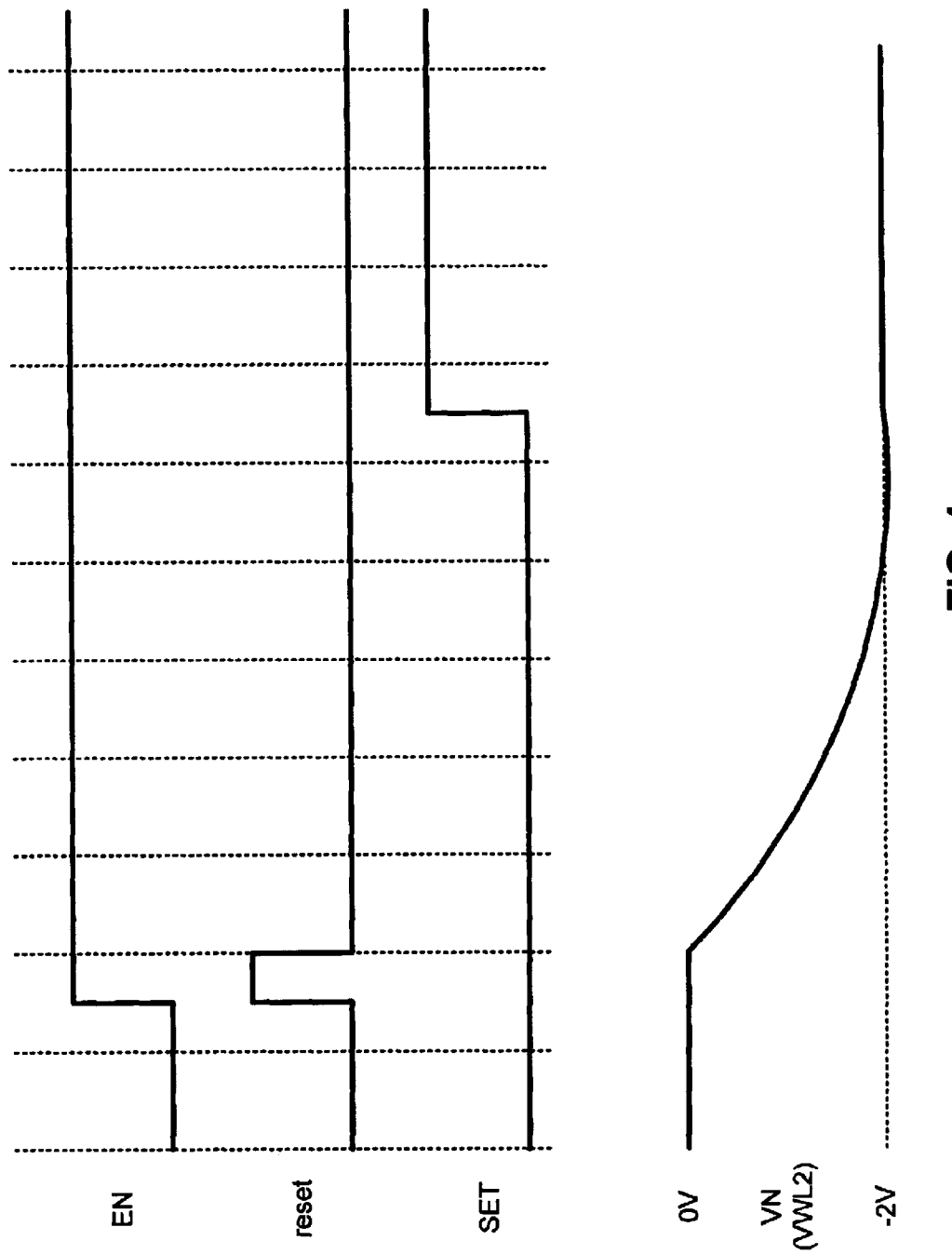
FIG. 4 shows a timing diagram associated with the negative voltage regulator shown in FIG. 2.

FIG. 4 shows a timing diagram associated with the negative voltage regulator 10 shown in FIG. 2. The negative voltage supply VN 26 sequence can be seen to commence following enable EN and internal reset pulses, at which time the negative voltage supply VN 26 begins to drop from its initial value of 0V until reaching its final value of −2V. A signal named SET is asserted after VN first crosses its desired final value.

Figure 6:
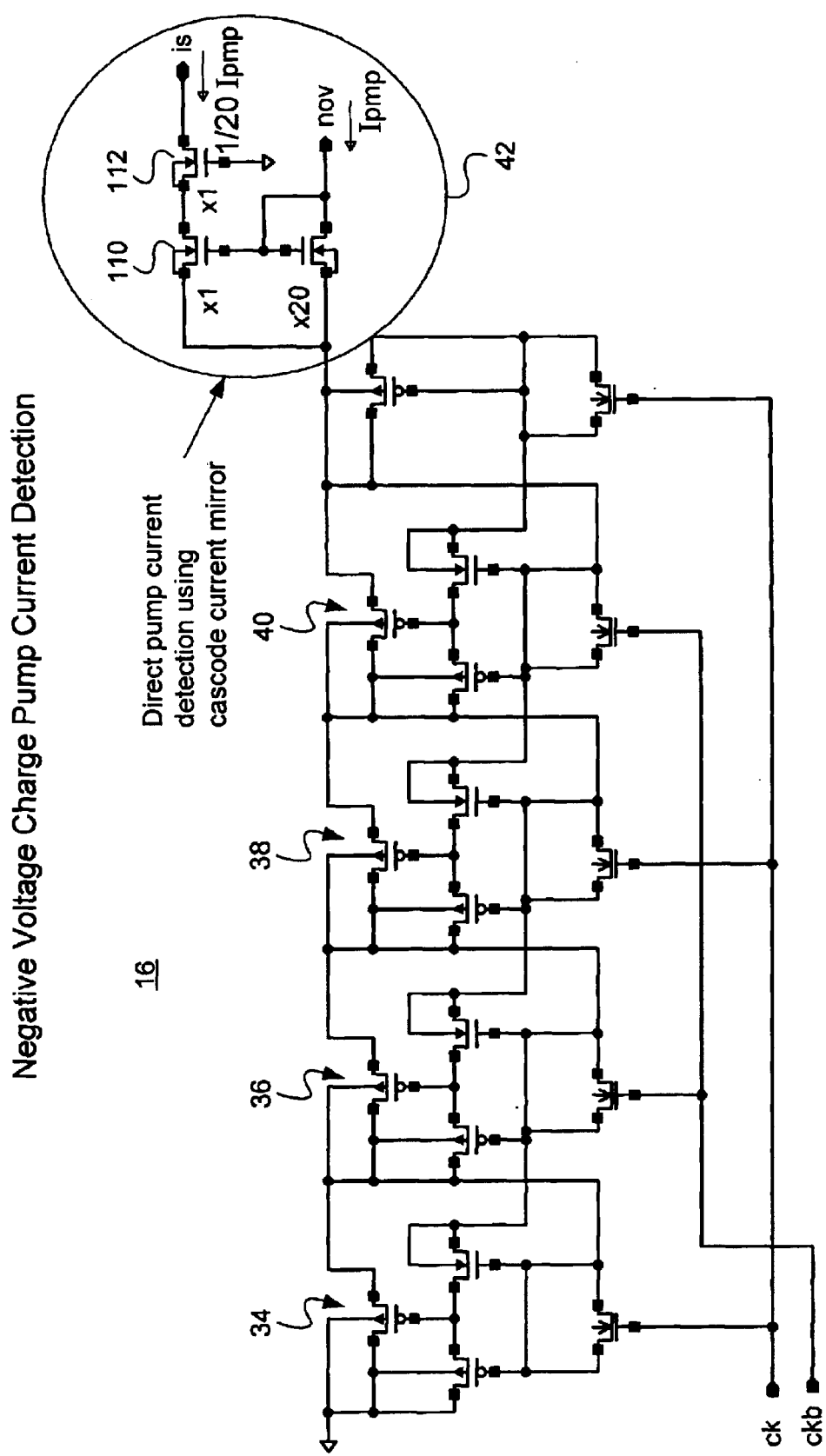
FIG. 6 is a schematic diagram illustrating one technique of providing negative voltage charge pump current detection suitable for use with the negative voltage regulator shown in FIG. 2.

Looking now at FIG. 6, a schematic diagram illustrates one technique of providing negative voltage charge pump current detection suitable for use with the negative voltage regulator 10 shown in FIG. 2. The negative voltage charge pump 16 comprises four stages 34, 36, 38, 40 and a current mirror 42. Each stage 34–40 most preferably provides an equal amount of voltage drop; wherein the total voltage drop depends on the swing of the input clock (enumerated as 44 in FIG. 2), threshold voltages of the MOS devices, the ratio between the main capacitances and the parasitic capacitances, the frequency of the input clock 44 and the load current. The NMOS current mirror 42 at the output of the charge pump 16 is employed to detect the current through the charge pump 16. The current detection is then used to achieve the desired power regulation as described further herein below. A cascode transistor N1 (112) is coupled in series to the mirror transistor 110. The gate of cascode transistor 112 is biased at ground or an appropriate voltage to both isolate the mirror transistor 110 from the increased charge pump output voltage and improve the output impedance of the current mirror 42.

Figure 7:
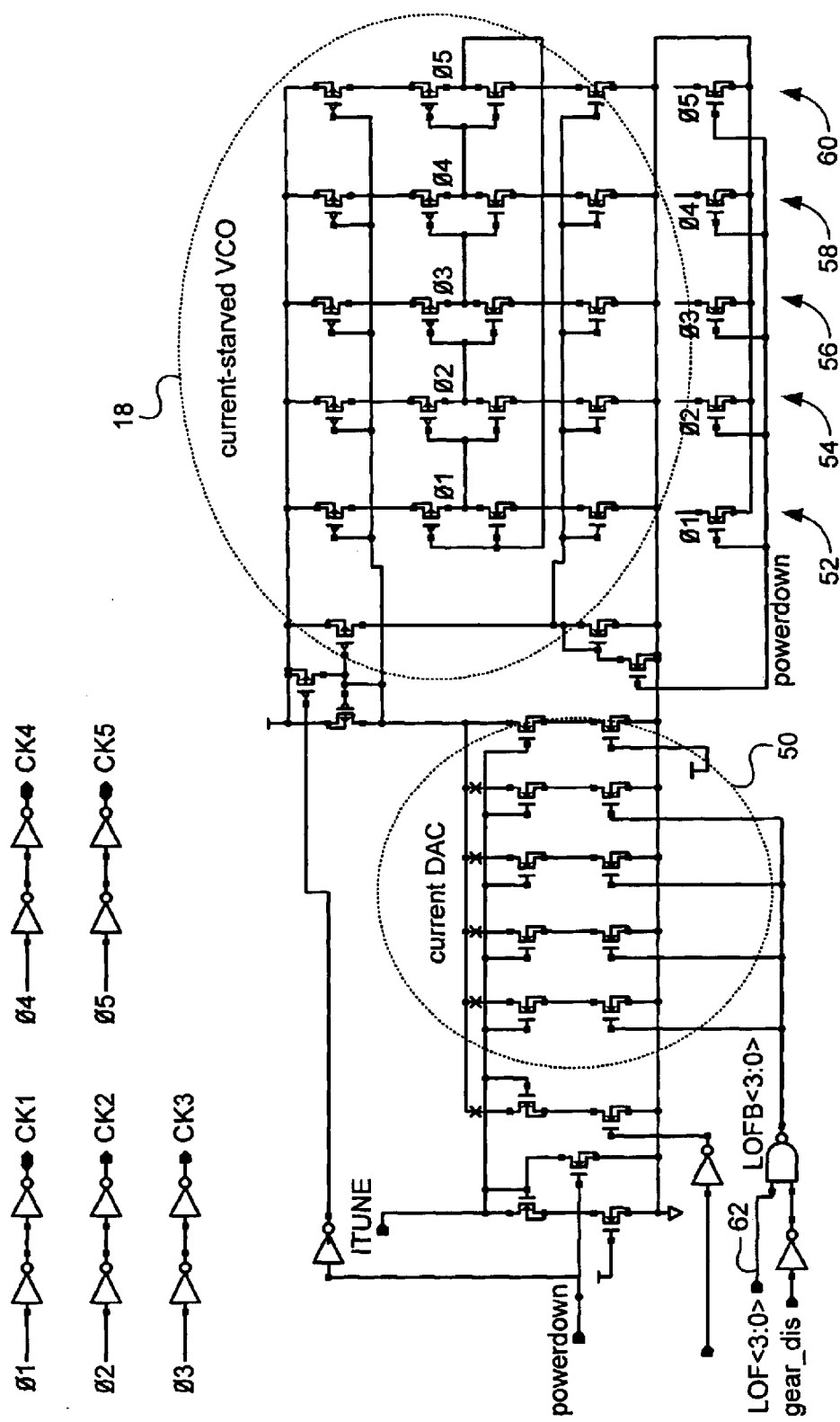
FIG. 7 is a schematic diagram illustrating one technique of implementing a VCO and a current DAC for frequency stepping suitable for use with the negative voltage regulator shown in FIG. 2.

FIG. 7 is a schematic diagram illustrating one technique of implementing a VCO 18 and a current DAC 50 for frequency stepping suitable for use with the negative voltage regulator 10 shown in FIG. 2. The VCO 18 is a ring oscillator comprising five stages of starved inverters 52, 54, 56, 58, 60. It can be a voltage-controlled oscillator (VCO), current-controlled oscillator (ICO) or, in a broader sense, any oscillator whose frequency is tunable via an input control signal or signals. The oscillator in FIG. 7 is configured as an ICO. The current is programmed via LOF<0:3> 62 to discretely tune the frequency of the output clock. The present inventors found an oscillator 18 frequency range of about 50 MHz through about 300 MHz to provide workable results. Two adjacent oscillator 18 clock phases are used to generate a pair of non-overlapping clocks driving the charge pump 16.

Figure 5:
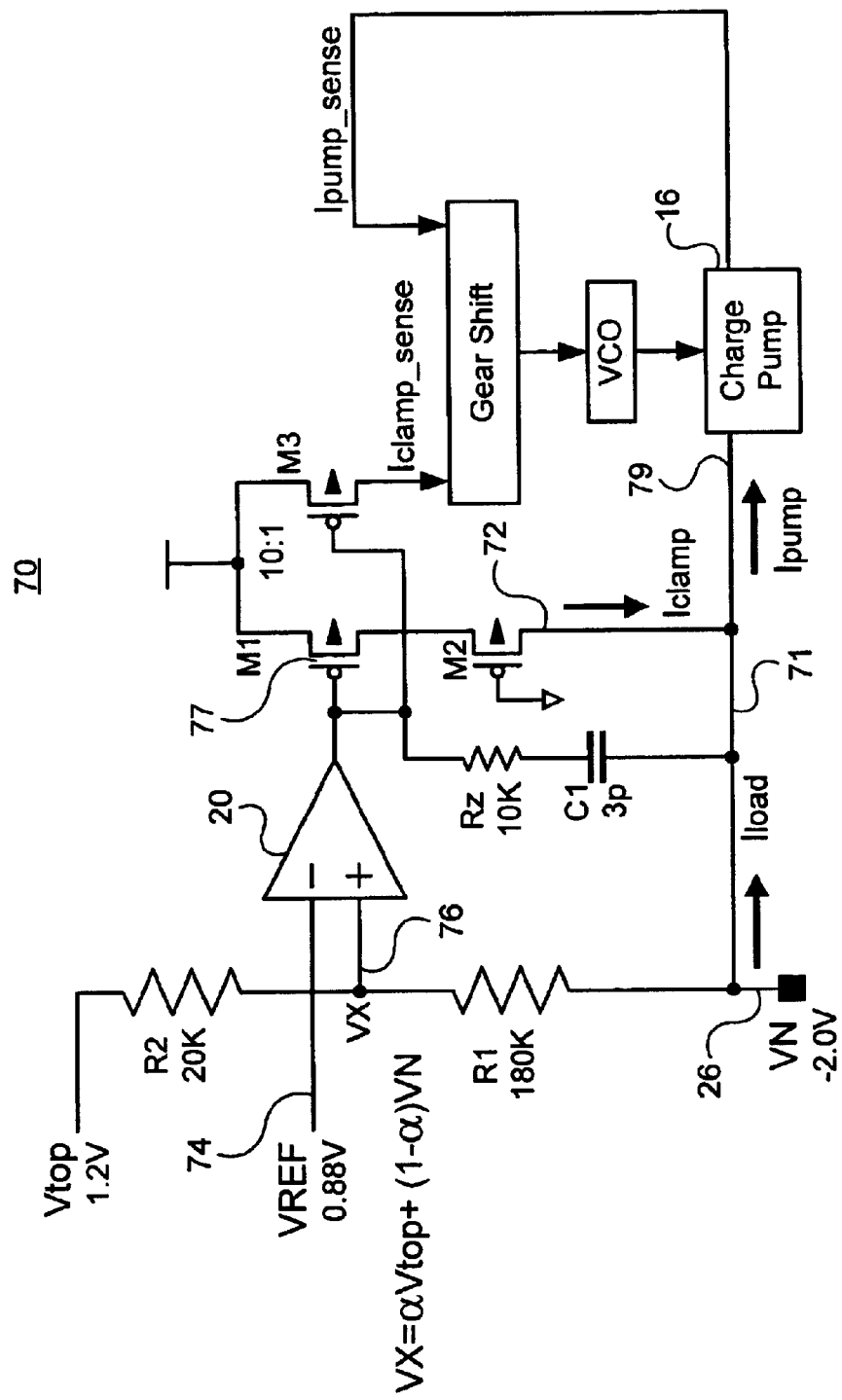
FIG. 5 is a schematic diagram illustrating one technique of providing positive clamp regulator frequency compensation suitable for use with the negative voltage regulator shown in FIG. 2.

With reference now to FIG. 5, a schematic diagram illustrates one technique of providing positive clamp regulator frequency compensation suitable for use with the negative voltage regulator 10 shown in FIG. 2. The positive clamp regulation loop 70 regulates the negative voltage VN 26 and further supplies the clamp current 72. A variation in the load current will cause a disturbance in VN 26. An OPAMP 20 in the loop compares a reference voltage 74 with a voltage VX 76 derived from the negative voltage 26. The OPAMP 20 then regulates the clamp current 72 in response to the outcome of the comparison. The charge pump 16 current $I_{pump}$ is thus continuously adjusted since it is the sum of the load current and clamp current. Notice in FIG. 5 that $I_{pump\_sense}$ is a measurement of and proportional to $I_{pump}$; $I_{clamp\_sense}$ is a measurement of and proportional to $I_{clamp}$. In one embodiment, the bandwidth of the voltage/current regulation loop 70 was found by the present inventors to be about 7 MHz through about 13 MHz with VCC at 1.8V (phase margin 40°–58°), and to be about 10 MHz through about 17 MHz with VCC at 2.5V (phase margin 38°–50°), across process, supply voltage and temperature corners.

More specifically, the regulation of the negative voltage VN 26 is performed via the voltage feedback loop 12 (not by the current loop segment) with positive current clamping. A voltage divider extracts a positive voltage VX 76 from the negative voltage VN 26, and an auxiliary voltage Vtop, such that the extracted voltage is proportional to the negative voltage VN 26, wherein $VX=(1-\alpha)VN+\alpha V\text{top}$, and where 0<α<1. OPAMP 20 compares the extracted voltage with a readily available positive reference voltage VREF 74 and amplifies the difference. A PMOS 77 driven by this OPAMP 20 in turn generates a current $I_{clamp}$ 72 that is proportional to the comparison result. A cascode MOS transistor M2 (78) coupled in series with PMOS 77 isolates PMOS 77 from the increased regulator output voltage to prevent voltage breakdown of PMOS 77. The gate of cascode MOS transistor 78 is biased at ground or any appropriate voltage to maximize, without breakdown, the voltage drop between the drain and source of PMOS 77. The cascode MOS transistor 78 also stands to improve the gain of the positive clamp regulator loop.

A Miller compensation capacitor 120 in series with a resistor 122 is used to realize frequency compensation or stabilization of the positive clamp regulator loop. Note this frequency compensation is separate from the frequency of the clock for the charge pump 16. One terminal of Miller compensation capacitor 120 is coupled to the regulator output node while one terminal of resistor 122 is coupled to the gate of PMOS 77. It is necessary and key to choose such values of the Miller compensation capacitor 120 and the resistor 122 such that the loop will be stable under all load conditions.

An important characteristic of this voltage feedback loop is that the charge pump current, $I_{pump}$ 79, is the sum of the load current 71 and the clamp current 72. Understandably, the PMOS 77 current is called clamp current since the charge pump current is clamped at this current when there is no load current.

A variation in the load current 71 causes a change in the pump current 79; and hence a change (error) in VN 26. The OPAMP 20 and PMOS 77 will respond to this change and produce a corresponding change to the clamp current 72, which in turn compensates for the change in the pump current 79 by virtue of current summing, thus correcting the error in VN 26 due to load current variation. This process then is the mechanism of voltage regulation responsible for setting VN 26 at a desired negative voltage.

While the current loop segment 22 ultimately steps the pump current 79 in response to different levels of load current 71, by measuring the amount of contribution the clamp current 72 makes to the pump current 79 and stepping the frequency accordingly, the primary function of the current loop segment 22 is to perform coarse tuning of the power consumption instead of voltage regulation. Power tuning is achieved by stepping the frequency of the clock 44 driving the charge pump 16 and ultimately stepping pump current 79. Significantly, the voltage loop 12 is continuous in time, while the current loop segment 22 is discrete. A continuous current loop segment is also possible with a continuously-tunable oscillator and a continuously-tuned clock frequency. Importantly, both loops 12, 22 interact with one another, involving the clamp current 72, the pump current 79 and the load current 71.

Those skilled in the charge pump art will appreciate the voltage drop Vd associated with a charge pump is a function of the pump current $I_{pump}$ and the clock frequency f, according to the following simplified relation $$Vd \sim V^* - I_{pump}/(f \cdot C),$$

where V* is a characteristic voltage, with the clock swing factored in, of the charge pump and C is the capacitance in each stage of the charge pump. One can therefore tune Vd simply by adjusting $I_{pump}$ and/or f. The voltage loop 12 regulates $I_{pump}$ 79 while the current loop segment 22 directly adjusts f, and indirectly $I_{pump}$ 79. At a given f, the voltage loop 12 tunes the clamp current $I_{clamp}$ 72 to sustain $I_{pump}$ 79 and hence the voltage drop at VN 26. When the voltage loop 12 settles, one can adjust f and indirectly force the clamp current $I_{clamp}$ 72 via the voltage loop, and $I_{pump}$ 79 via current summing, to change simultaneously, lowering or raising current in the charge pump 16. The current loop segment 22 and the voltage loop 12 then importantly are interleaved and operate in tandem with one another. The dual loop action is further illustrated as follows.

The clamp current $I_{clamp}$ 72 rises when the load current drops. If $I_{clamp}$ 72 surpasses the upper current threshold, indicating that $I_{clamp}$ 72 has become a significant portion of $I_{pump}$ 79, then the load current must be only a small portion of $I_{pump}$ 79 due to current summing. A significant portion of $I_{pump}$ 79 is wasted. One can lower $I_{pump}$ 79 and $I_{clamp}$ 72 while maintaining the desired output voltage VN 26. The current loop reacts by lowering the clock frequency by one step, causing the charge pump 16 output voltage VN 26 to drift toward 0V. The OPAMP 20 senses the change and drives higher the gate of the main transistor 77 to lower $I_{clamp}$ 72. $I_{pump}$ 79 will decline accordingly until $I_{clamp}$ 72 drops below the upper current threshold. $I_{pump}$ 79 is thus minimized while sustaining VN 26. Clearly, the voltage loop, comprised of the OPAMP 20 and the transistor 77, is an integral part of the current loop action.

Conversely, a rise in the load current will, through the current loop action, raise $I_{pump}$ 79 in order to supply the increased load current and maintain VN 26.

The dependence of the pump current 79 on the clock frequency stems from the mechanism of the charge pump 16 and the action of the voltage loop. Therefore the completion of the current regulation by the current loop incorporates the action by the voltage loop. Hence the word dual loop.

Figure 8:
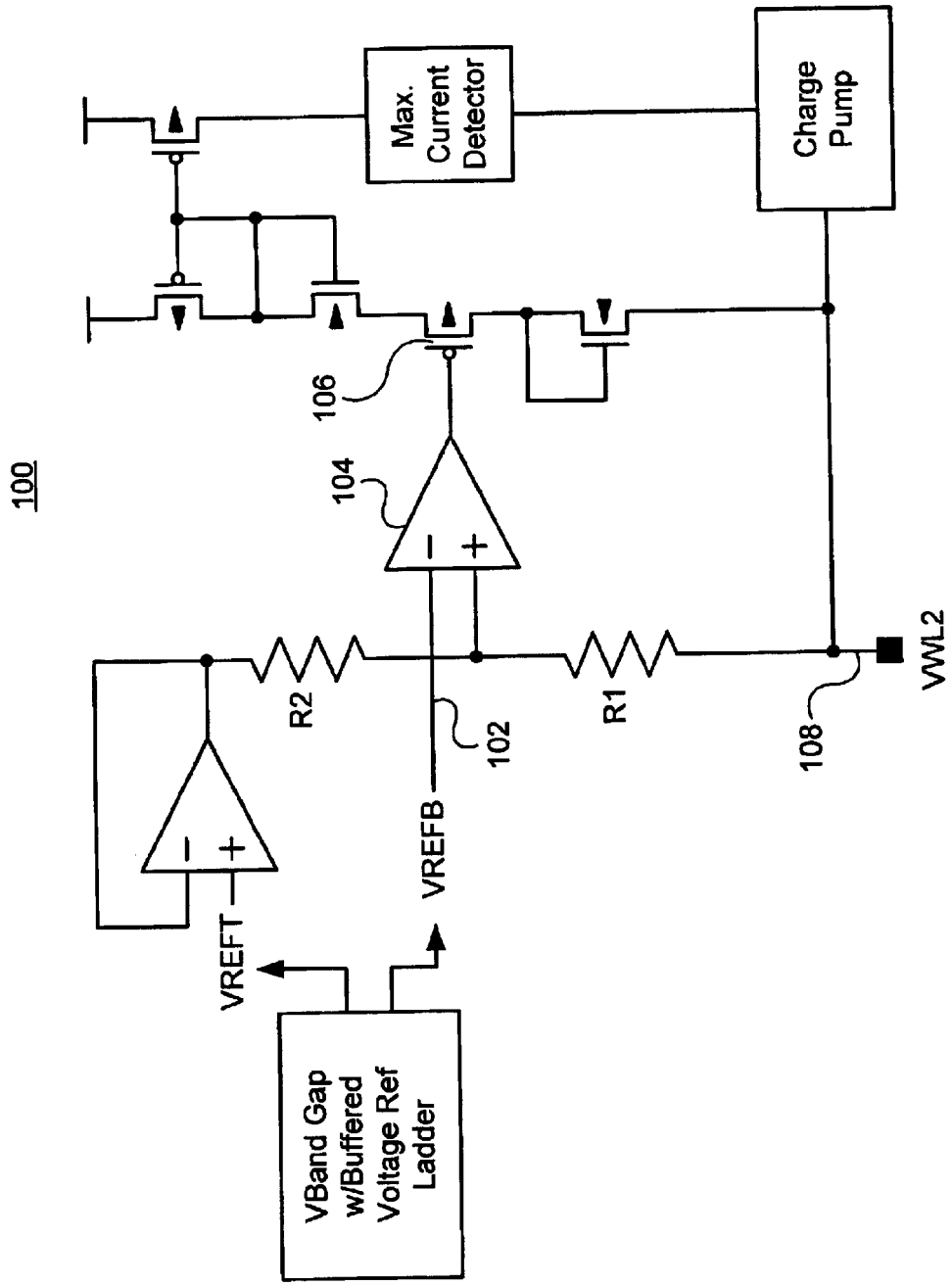
FIG. 8 is a simplified schematic diagram illustrating a negative voltage regulator using a voltage loop to force a word line 2 output voltage according to one embodiment of the present invention.

FIG. 8 is a simplified circuit diagram illustrating a word line 2 negative voltage generator (WL2NVG) 100 that exemplifies a more limited application of the principles described herein with reference to the charge pump based negative voltage regulator shown in FIG. 2. With its VREFB input 102 and its negative feedback through the resistor divider R2/R1, the OpAmp 104 drives the PMOS clamp 106, only sensing the voltage difference between the output VWL2 108 and the voltage difference Vdiff that equals VREFT−VREFB. Negative voltage generator 100 then exemplifies a voltage loop, forcing the VWL2 output voltage. Both reference voltages, VREFT and VREFB are most preferably derived from a single Bandgap voltage reference VBG, input to a buffered voltage reference ladder having a plurality of output voltage taps. In this way, VREFT and VREFB can track one another within the resistor ratio of these taps. The present inventors were able to achieve excellent tracking (better than 0.3%) using substantially identical and well matched resistor elements connected in series and parallel to form centroidal ladder structures.

Figure 9:
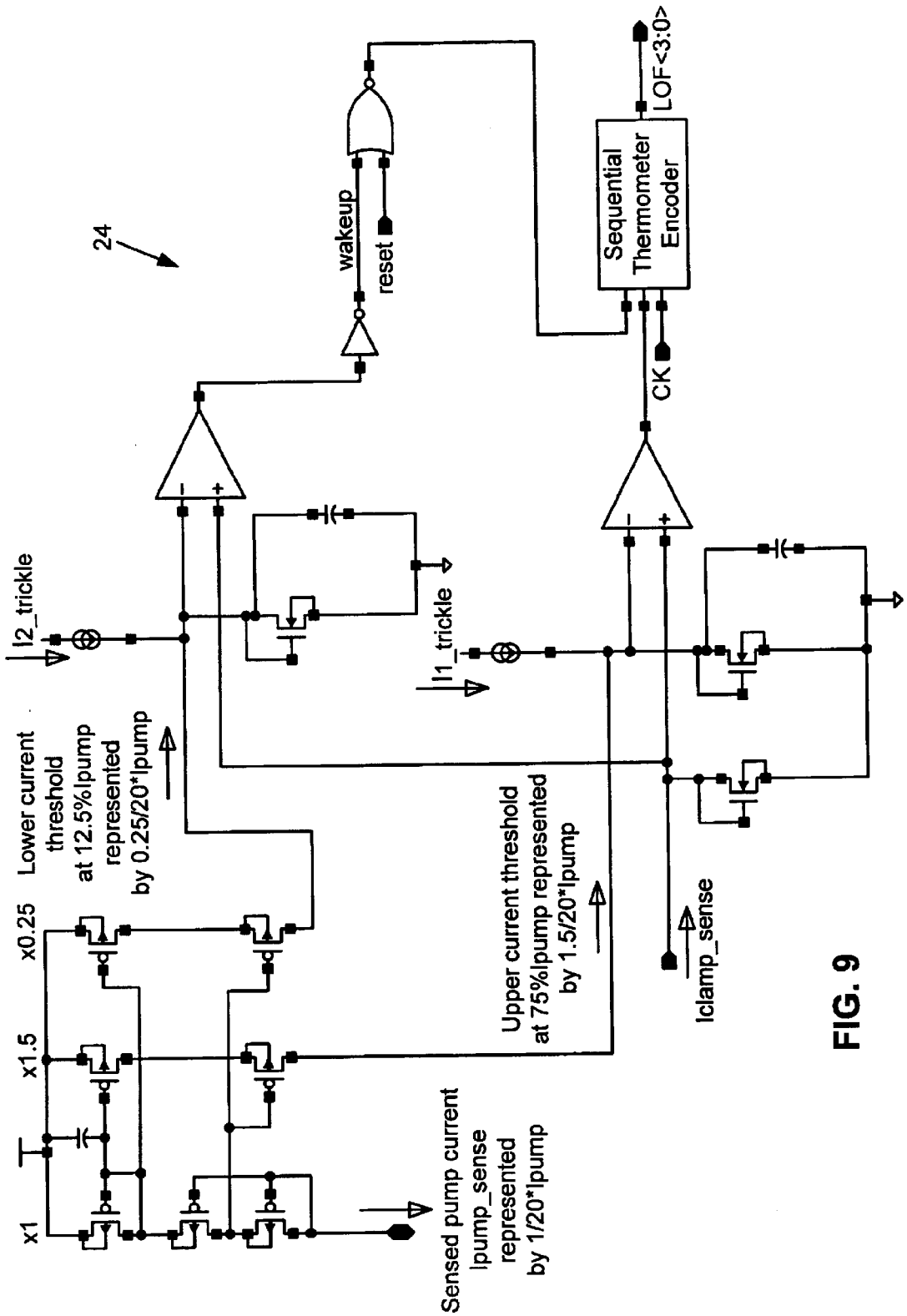
FIG. 9 is a schematic diagram illustrating one technique of providing a gear shift with current comparators and a sequential thermo encoder suitable for use with the negative voltage regulator shown in FIG. 2.
Figure 10:
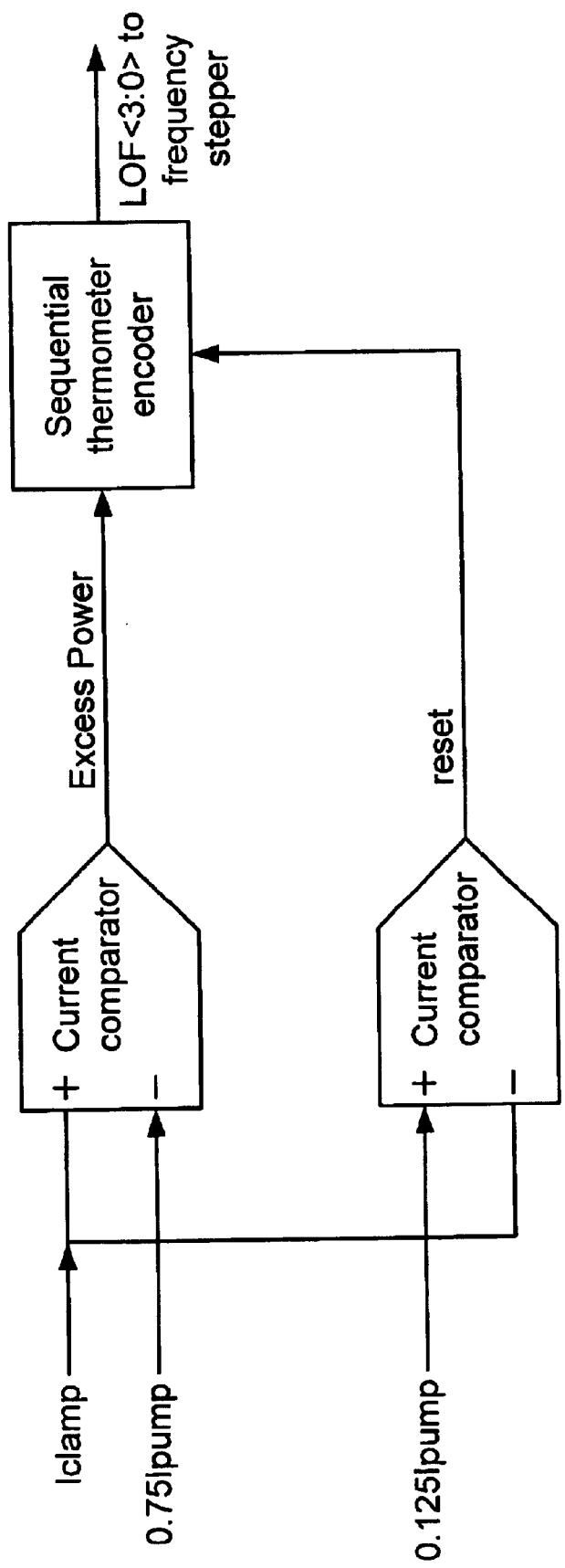
FIG. 10 is a block diagram illustrating a more simplified version of the gear shift mechanism depicted in FIG. 9.
Figure 11:
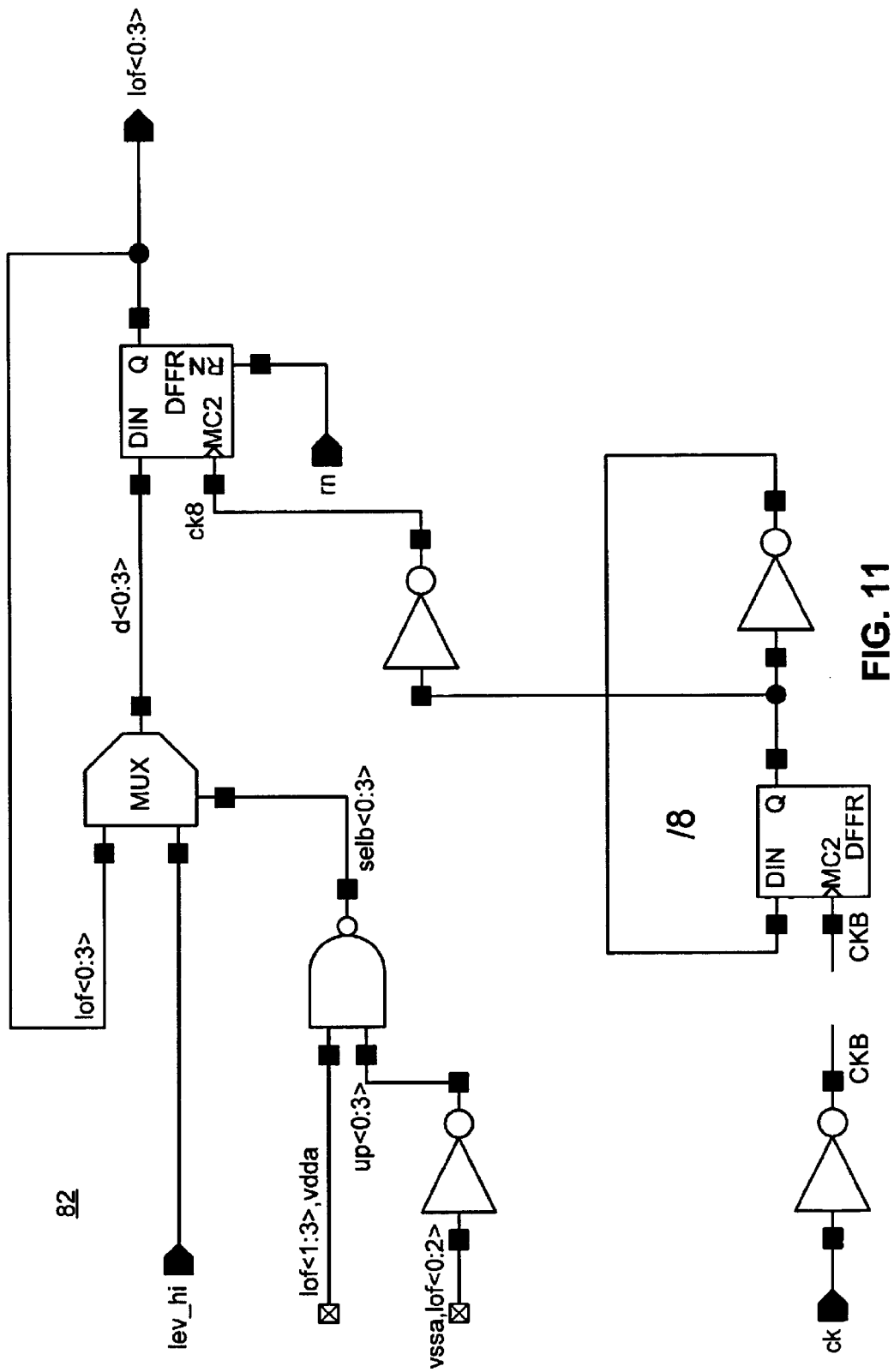
FIG. 11 is a more detailed schematic diagram of the sequential thermo encoder shown in FIG. 9.

FIG. 9 is a schematic diagram illustrating one technique of providing a gear shift 24 with current comparators and a sequential thermo encoder 82 suitable for use with the negative voltage regulator 10 shown in FIG. 2. The gear shift circuit 24 performs the task of power regulation, and compares the clamp current, $I_{clamp}$, 72 of the regulation loop 70 with the charge pump current, $I_{pump}$ 79. In one embodiment, depicted in FIG. 10, if $I_{clamp}$ 72 exceeds 75% $I_{pump}$ 79, the VCO 18 gear is shifted down by one notch by decrementing the frequency. Otherwise, the VCO 18 gear is shifted up by one notch. Then, if $I_{clamp}$ 72 drops below 12.5% $I_{pump}$ 79, the VCO 18 will be immediately forced into the highest gear to accommodate any sudden surge in the load current. The frequency control signal LOF<0:3> 62 is thermometer coded via a sequential thermo encoder 82 that is shown in more detail in FIG. 11. A frequency divider is employed to delay the sampling of the comparison result and minimize bouncing between gear levels. Table 1 below compares gear levels, frequency control signal states and VCO 18 frequency in MHz.

TABLE 1

| | | | | | VCO FREQUENCY (MHZ) | | |
| --- | --- | --- | --- | --- | --- | --- | --- |
| Gear | LOF3 | LOF2 | LOF1 | LOF0 | SSS 1.6 V | SSS 2.8 V | FFF 1.6 V |
| 5 (highest) | 0 | 0 | 0 | 0 | 300 | 137 | 350 |
| 4 | 1 | 0 | 0 | 0 | | | |

TABLE 1-continued

| | | | | | VCO FREQUENCY (MHZ) | | |
|---|---|---|---|---|---|---|---|
| Gear | LOF3 | LOF2 | LOF1 | LOF0 | SSS 1.6 V | SSS 2.8 V | FFF 1.6 V |
| 3 | 1 | 1 | 0 | 0 | | | |
| 2 | 1 | 1 | 1 | 0 | | | |
| 1 (lowest) | 1 | 1 | 1 | 1 | 59 | 40 | 80 |

As stated herein before, the gear shift circuit 24 generated frequency control signals LOF<0:3> based on the quantitative relationship between the clamp current $I_{clamp}$ 72 and the pump current $I_{pump}$ 79. Pump current 79 is most preferably filtered before the comparison between $I_{clamp}$ 72 and $I_{pump}$ 79 in order to filter any high frequency components caused by the clocking nature of the charge pump 16. The frequency controls are thermometer-coded, as also stated herein before, to prevent glitching during a transition. This sequential thermometer encoder 82, according to one embodiment, is essentially an accumulator.

Figure 12:
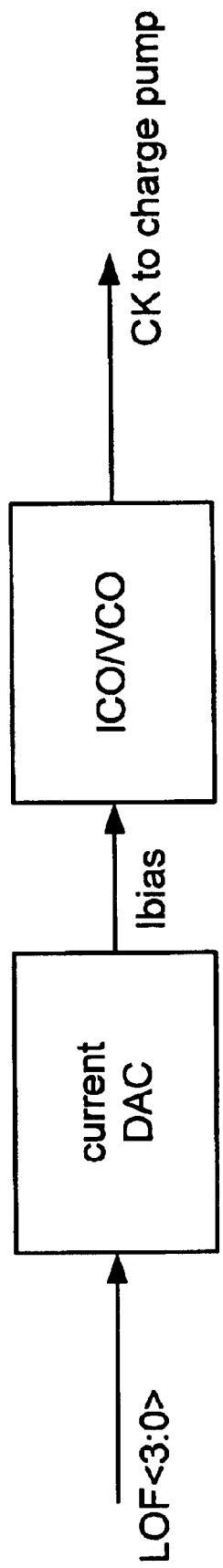
FIG. 12 is a simplified block diagram the frequency stepping mechanism associated with the gear shift depicted in FIG. 9.

Regarding one embodiment of the gear shift mechanism 24, when $I_{clamp}$ 72 exceeds the upper threshold, i.e., $I_{clamp} > \beta \cdot I_{pump}$ ($0 < \beta < 1$, e.g., $\beta = 0.75$), indicating excess power in the charge pump 16, LOF3 will become high to lower the frequency by a notch. After eight clock cycles, the excess power indicator is checked again. If it is still positive, LOF2 will go high, further lowering the frequency; otherwise, LOF3 will be reset and the frequency will backtrack. The sequence of going high is LOF3, LOF2, LOF1 and LOF0 with LOF3 being the first if this indicator stays high. In the case where all LOF<0:3> are high (lowest f), and the excess power indicator turns negative, LOF0, LOF1, LOF2 and LOF3 will become low with LOF0 being the first. FIG. 12 is a simplified block diagram illustrating this mechanism of frequency stepping.

Whenever $I_{clamp}$ 72 drops below the lower threshold, i.e., $I_{clamp} < \gamma \cdot I_{pump}$ ($0 < \gamma < 1$, e.g., $\gamma = 0.125$), indicating under power relative to load current 71, all LOF<0:3> will be simultaneously forced low, immediately forcing the highest clock frequency into the charge pump 16. The wakeup mode usually takes place when, for example, there is a sudden surge in load activity. Upon power-up, both the clamp current $I_{clamp}$ 72 and the charge pump current $I_{pump}$ 79 could approach zero. The outcome of the comparison between the two would then be uncertain and might trap the regulator in an undesirable slow ramping mode or even a deadlock condition. A trickle current is shunted into each of the upper current threshold and the lower current threshold to force the regulator into the wakeup mode at power-up, rapidly ramping the charge pump current 79 and its output voltage.

Looking again at FIG. 2, the negative voltage regulator 10 can be seen to also include a sequence element 90. The sequence element 90 monitors the EN signal as well as the frequency control signal LOF<0:3> 62, and asserts the status indication signal SET when VN 26 has first crossed its desired final value as shown in FIG. 4 discussed herein before.

Figure 13:
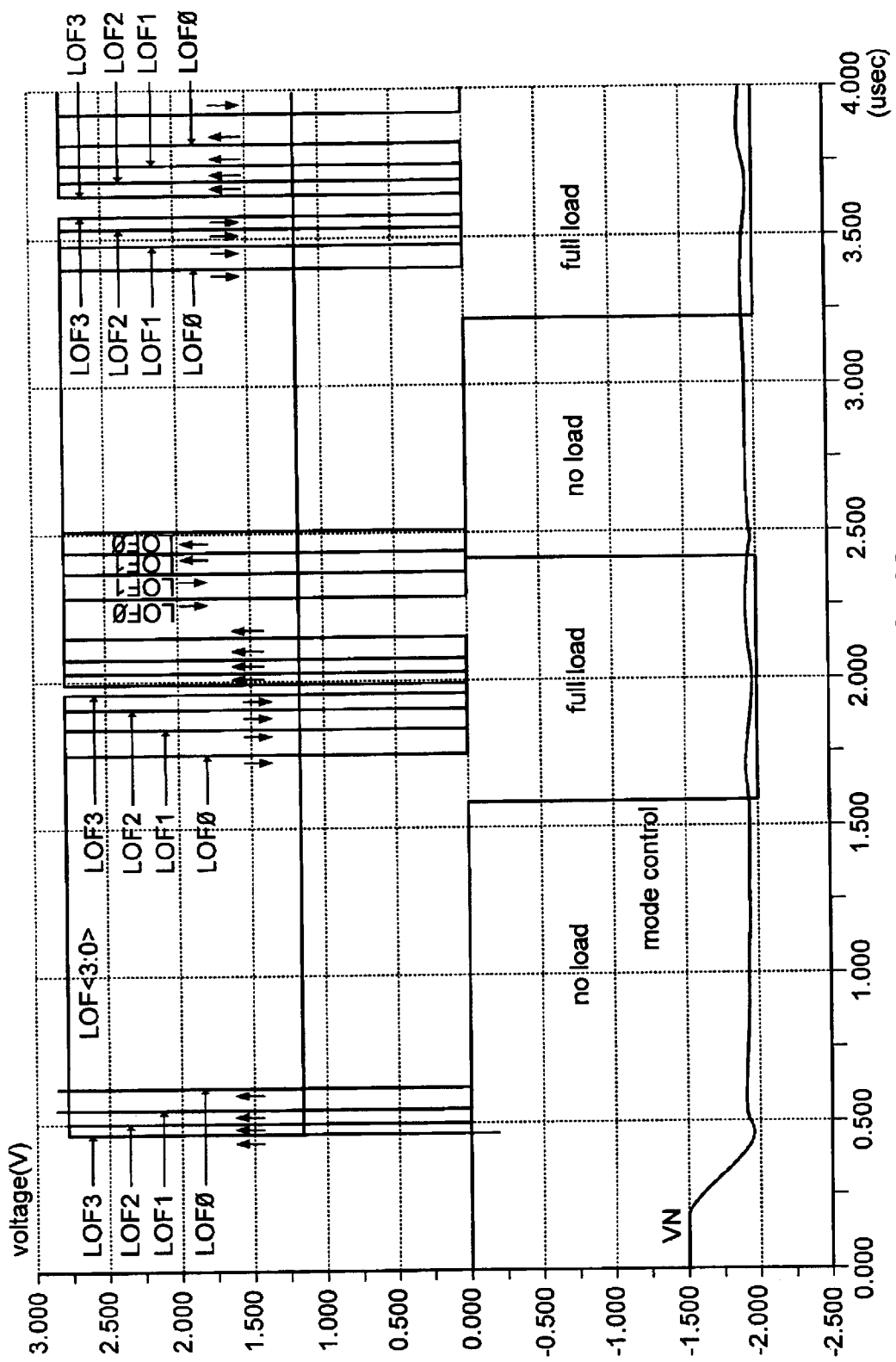
FIG. 13 is a timing diagram illustrating gear shift response to alternating no load and full load conditions for the gear shift depicted in FIG. 9.
Figure 14:
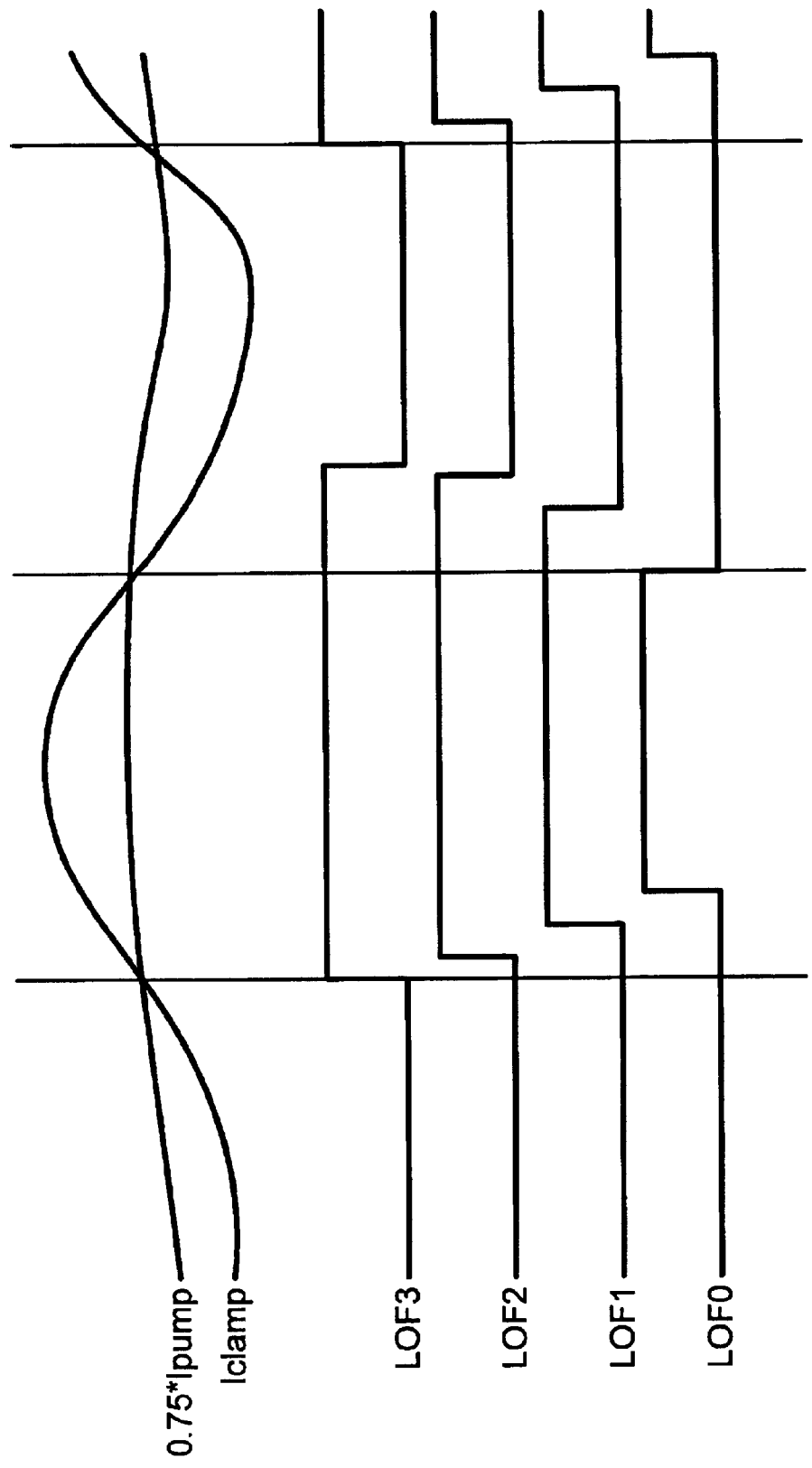
FIG. 14 is a timing diagram illustrating gear shift response to achieve small power stepping for the gear shift depicted in FIG. 9.
Figure 15:
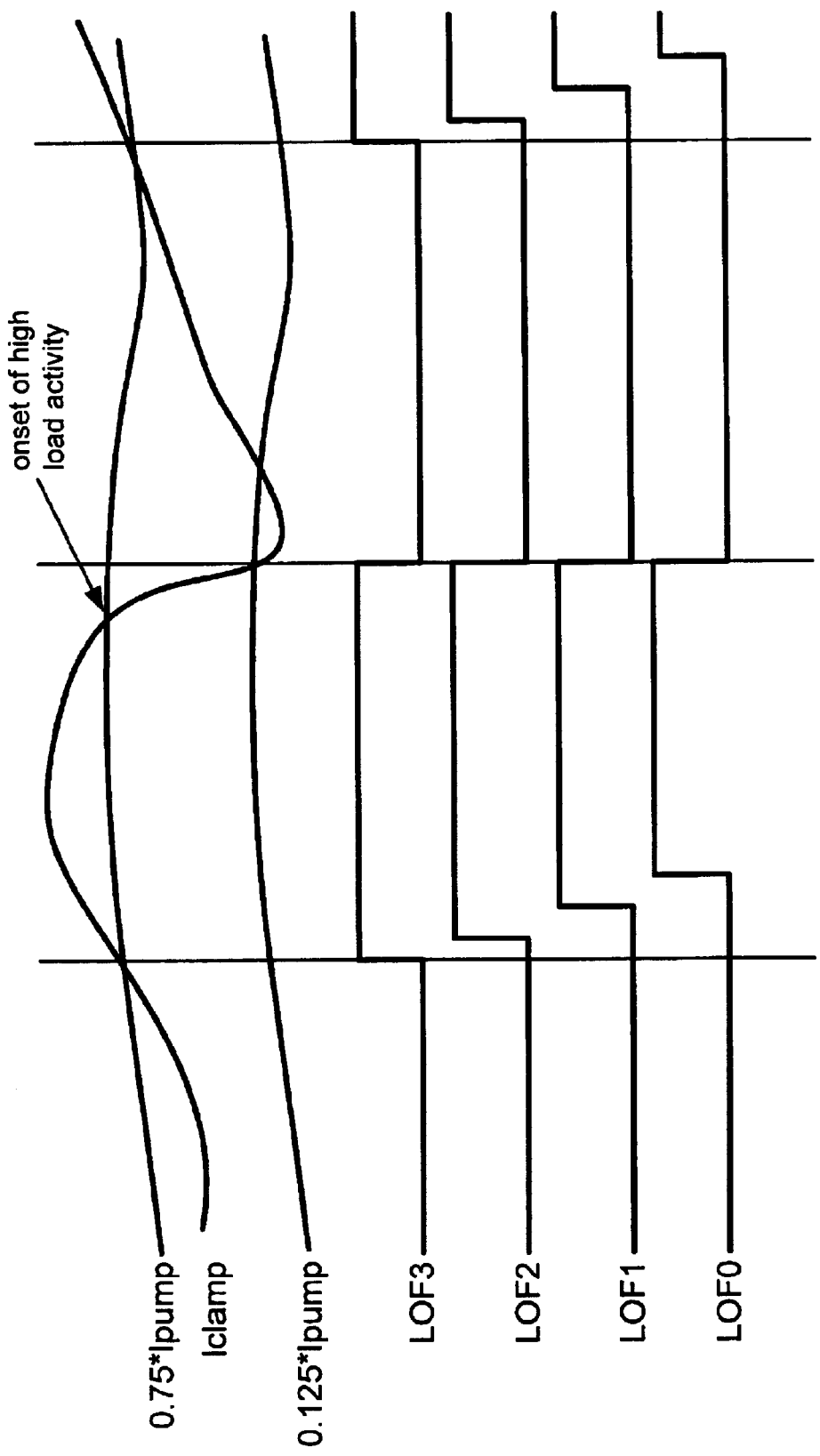
FIG. 15 is a timing diagram illustrating gear shift response during wake-up for the gear shift depicted in FIG. 9.

FIG. 13 is a timing diagram illustrating gear shift response to alternating no load and full load conditions for the gear shift 24 depicted in FIG. 9; while FIG. 14 is a timing diagram illustrating gear shift response to achieve small power stepping for the gear shift 24 depicted in FIG. 9; and FIG. 15 is a timing diagram illustrating gear shift response during wake-up for the gear shift 24 depicted in FIG. 9.

Figure 16:
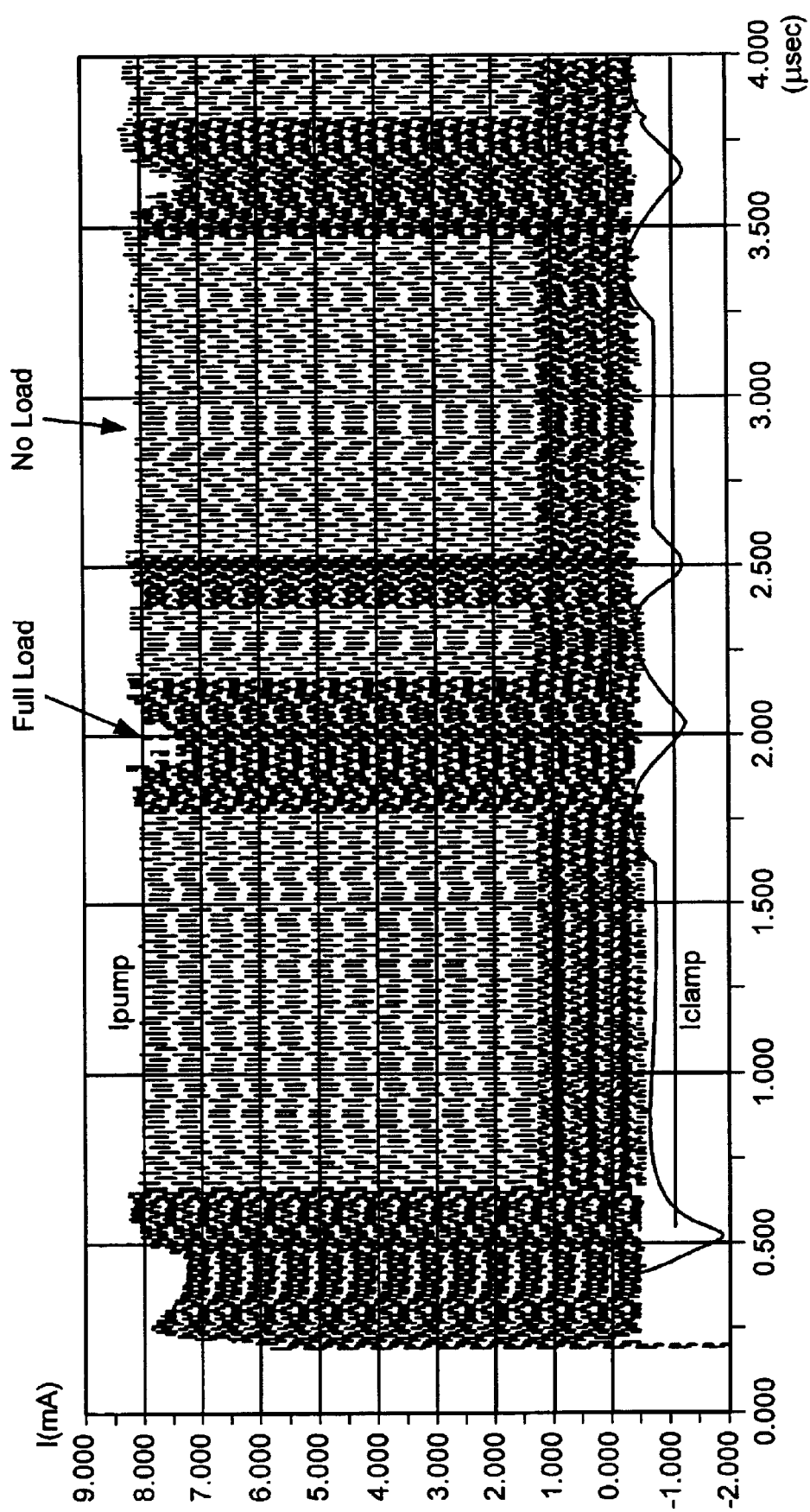
FIG. 16 is a diagram illustrating the effect of power regulation on pump current for one embodiment of the negative voltage regulator shown in FIG. 2.

FIG. 16 is a waveform diagram illustrating the effect of power regulation on pump current for one embodiment of the negative voltage regulator 10 shown in FIG. 2.

In summary explanation, a charge pump based voltage regulator with smart power regulation employs an architecture that requires that the charge pump current be a linear combination of the load current and a clamp current with a possible offset current. The smart power regulation is based on automatic load activity (or load current) detection using the clamp current. The clamp current and the filtered charge pump current are compared with one another; and the charge pump current is then adjusted accordingly by stepping the frequency of the clock driving the charge pump, optimizing the power consumption of the entire voltage regulator with varying load activity.

This invention has been described in considerable detail in order to provide those skilled in the voltage regulator art with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow. For example, while certain embodiments set forth herein illustrate various hardware implementations, the present invention shall be understood to also parallel structures and methods using software implementations or combinations of both as set forth in the claims.

What is claimed is:

1. A charge pump based negative voltage generator (CPNVG) responsive to a charge pump current wherein the charge pump current comprises a linear combination of a load current and a clamp current.

2. The CPNVG according to claim 1 wherein the clamp current is generated in response to a variation in the load current to regulate the charge pump current such that power consumption associated with the CPNVG is substantially optimized while maintaining a desired output voltage.

3. The CPNVG according to claim 2 wherein a derivative of the desired output voltage is compared with a reference voltage to generate a clamp current control signal.

4. The CPNVG according to claim 3 wherein the reference voltage is solely positive.

5. The CPNVG according to claim 3 wherein the clamp current is proportional to the clamp current control signal.

6. The CPNVG according to claim 5 further comprising a Miller capacitor and a series resistor configured to provide voltage feedback loop frequency compensation associated with the clamp current control signal under varying and disparate load conditions.

7. The CPNVG according to claim 6 further comprising a main MOS transistor and a cascode MOS transistor, wherein the main MOS transistor is driven via an operational amplifier in the voltage feedback loop to generate the clamp current and the cascode transistor with its gate biased stands to improve loop gain and prevent voltage breakdown due to stress caused in response to increased positive or negative output voltages.

8. The CPNVG according to claim 6 further comprising a cascode MOS transistor in series with a mirror MOS transistor in a current detection circuit associated with the charge pump to improve output impedance associated with a current mirror and further to substantially prevent voltage breakdown caused by stress associated with increased positive or negative output voltages.

9. The CPNVG according to claim 1 further comprising a gearshift circuit operational to shunt a trickle current with a lower threshold charge pump current to prevent a deadlock condition during start-up of the CPNVG.

10. The CPNVG according to claim 1 further comprising a gearshift circuit operational to shunt a trickle current with an upper threshold charge pump current to prevent a deadlock condition during start-up of the CPNVG.

11. The CPNVG according to claim 1 further comprising a gearshift circuit operational to force the charge pump to generate maximum current when the clamp current drops below a desired fraction of the charge pump current.

12. The CPNVG according to claim 1 further comprising a gearshift circuit operational to force the charge pump to lower its current when the clamp current exceeds a desired fraction of the charge pump current.

13. The CPNVG according to claim 12 wherein the charge pump is operational to detect current at its output.

14. The CPNVG according to claim 13 further comprising a feedback loop operational to compare a desired portion of the detected charge pump current with a desired portion of the clamp current generated via a voltage/current regulation loop to generate a compare signal thereof.

15. The CPNVG according to claim 14 further comprising a circuit configured to vary a clock driver frequency in response to the compare signal, wherein the clock driver is operational to drive the charge pump.

16. The CPNVG according to claim 15 further comprising a frequency divider operational to delay sampling of the compare signal.

17. The CPNVG according to claim 15 further comprising a sequential thermometer encoder operational to encode frequency control signals associated with the compare signal.

18. The CPNVG according to claim 1 wherein its output operational supplies a negative potential a driver of a word line of a thrysitor-based SRAM device and further operational compares the charge pump current with the clamp current and step a charge pump clock frequency and the clamp current to vary the power consumption of the entire CPNVG with activity of the thyristor-based SRAM.

19. The CPNVG according to claim 1 comprising a negative voltage charge pump operational to directly detect its output current, such that when the output current is supplied to a driver of a word line of a thyristor-based SRAM device, the CPNVG is operational to supply a negative potential for the word line, and further operational to compare charge pump output current with the clamp current and step a charge pump clock frequency and the clamp current to vary the power consumption of the entire CPNVG with activity of the thyristor-based SRAM.

20. The CPNVG according to claim 1 having an output current and comprising a feedback circuit operational to compare a desired portion of the output current with a desired portion of the clamp current, such that when the output current is supplied to a driver of a word line of a thyristor-based SRAM device, the CPNVG is operational to supply a negative potential for the word line, and further operational to step a charge pump clock frequency and the clamp current to vary the power consumption of the entire CPNVG with activity of the thyristor-based SRAM in response to the comparison.

21. The CPNVG according to claim 1 comprising a negative voltage charge pump having an output current and a circuit operational to vary a clock driver frequency in discrete steps in response to a desired compare signal to cause the clock driver to drive the negative voltage charge pump, such that when the negative voltage charge pump output current is supplied to a driver of a word line of a thyristor-based SRAM device, the CPNVG is operational to supply a negative potential to the word line, and further operational to step a charge pump clock frequency and the clamp current to vary the power consumption of the entire CPNVG with activity of the thyristor-based SRAM in response to the compare signal.

22. The CPNVG according to claim 1 comprising a negative voltage charge pump and a frequency divider operational to delay sampling of a tunable oscillator frequency control signal such that the tunable oscillator generates a stable clock driver to the negative voltage charge pump, wherein the CPNVG is operational to supply a negative potential to a word line of a thyristor-based SRAM device when the negative voltage charge pump is configured to supply an output current to a driver of the word line, and further wherein the CPNVG is operational to step a charge pump clock frequency and the clamp current to vary the power consumption of the entire CPNVG with activity of the thyristor-based SRAM in response to the compare signal.

23. The CPNVG according to claim 1 comprising a negative voltage charge pump and a sequential thermometer encoder to encode tunable oscillator frequency control signals such that a tunable oscillator generates a stable clock driver to the negative voltage charge pump, wherein the CPNVG is operational to supply a negative potential to a word line of a thyristor-based SRAM device when the negative voltage charge pump is configured to supply an output current to a driver of the word line, and further wherein the CPNVG is operational to step a charge pump clock frequency and the clamp current to vary the power consumption of the entire CPNVG with activity of the thyristor-based SRAM in response to the compare signal.

24. The CPNVG according to claim 1 wherein the output of CPNVG is coupled to at least one driver of a word line of a thyristor-based SRAM device.

25. The CPNVG according to claim 24 comprising a negative voltage charge pump configured to generate a negative potential, and further wherein the negative voltage charge pump comprises a detection circuit operational to detect current generated by the negative voltage charge pump.

26. The CPNVG according to claim 25 further comprising a feedback circuit operational to compare a desired portion of the detected current with a desired portion of the clamp current generated via a voltage/current regulator and to generate a compare signal thereof.

27. The CPNVG according to claim 26 further comprising a frequency stepper operational to vary a driver clock frequency in discrete steps such that the driver clock is operational to drive the negative voltage charge pump in response to the compare signal.

28. The CPNVG according to claim 27 further comprising a frequency divider operational to delay sampling of the compare signal via the frequency stepper to substantially minimize inadvertent bouncing between the discrete steps.

29. The CPNVG according to claim 28 further comprising a sequential thermometer encoder operational to encode frequency control signals associated with the driver clock frequency.

30. A method of regulating output voltage, the method comprising the steps of:
providing a negative voltage regulator (NVR) comprising smart power regulation;
comparing a desired portion of a charge pump current generated via the NVR with a desired portion of a clamp current generated via the NVR and generating a compare signal thereof; and stepping a charge pump clock frequency and the clamp current in response to the compare signal to optimize NVR power consumption with varying load activity.

31. The method according to claim 30 wherein the step of providing a NVR comprising smart power regulation comprises providing a NVR comprising:

a negative voltage charge pump operational to generate the output voltage and the charge pump current;

a tunable oscillator operational to drive the negative voltage charge pump;

a voltage/current regulation loop operational to generate the clamp current in response to a reference voltage and the output voltage; and a gear shift circuit operational to compare the clamp current and the charge pump current and generate tunable oscillator frequency control signals thereof.

32. The method according to claim 30 wherein the output voltage is a word line voltage associated with a thyristor-based SRAM array.

33. The method according to claim 30 wherein the load activity is associated with a thyristor-based SRAM array.

* * * * *